United States Patent [19]
Ochiai et al.

[11] Patent Number: 6,078,139
[45] Date of Patent: Jun. 20, 2000

[54] FRONT PANEL FOR PLASMA DISPLAY

[75] Inventors: Shinsuke Ochiai, Hyogo; Yukio Yasunori, Osaka; Satoshi Honda, Ehime, all of Japan

[73] Assignee: Sumitomo Chemical Company, Limited, Osaka, Japan

[21] Appl. No.: 09/099,207

[22] Filed: Jun. 18, 1998

[30] Foreign Application Priority Data

Jun. 19, 1997 [JP] Japan ................................. 9-162672

[51] Int. Cl.⁷ .................................................. H01J 17/49
[52] U.S. Cl. ......................... 313/582; 313/466; 313/489; 313/313
[58] Field of Search .................................. 313/582, 466, 313/489, 635, 313

[56] References Cited

U.S. PATENT DOCUMENTS

| | | |
|---|---|---|
| 3,647,729 | 3/1972 | Nagai et al. . |
| 4,296,214 | 10/1981 | Kamada et al. . |
| 4,732,454 | 3/1988 | Saito et al. . |
| 5,514,740 | 5/1996 | Miyake et al. . |
| 6,008,581 | 12/1999 | Ochiai et al. .......................... 313/582 |

*Primary Examiner*—V. Patel
*Attorney, Agent, or Firm*—Pillsbury Madison & Sutro LLP

[57] ABSTRACT

A front panel for a plasma display comprising a transparent substrate and two or more electroconductive films, each electroconductive film comprising a transparent polymer film with a transparent electroconductive layer on at least one surface thereof, can effectively shield an electromagnetic wave and can be produced in a simple process.

9 Claims, 2 Drawing Sheets

FRONT PANEL FOR PLASMA DISPLAY

FIELD OF THE INVENTION

The present invention relates to a front panel for a plasma display.

BACKGROUND OF THE INVENTION

A plasma display has been drawing attention as a display which has large surface area and is flats however, the screen thereof generates an electromagnetic wave which exerts an influence on other apparatuses and, it is therefore necessary to shield the wave.

For shielding an electromagnetic wave from a display, for example, a method has been suggested in which a front panel made by providing an electroconductive layer on a transparent substrate is placed in front of a CRT (Japanese Patent Application Publication (JP-B) No. Hei 7-89597;corresponding to U.S. Pat. No 4,732,454).

However, such a front panel has problems that a large scale vacuum deposition apparatus is required and the production method thereof is complicated since formation of an electroconductive layer by vacuum deposition method and the like is required for each transparent substrate.

SUMMARY AND OBJECTS OF THE INVENTION

The present inventors have intensively investigated to develop a front panel which can efficiently shield an electromagnetic wave generated from a screen of a plasma display and can be produced in a relatively simple process. As a result, it has been found that such a front panel can be obtained by placing two or more electroconductive films on a transparent substrate. The present invention has been accomplished on the basis of the above findings.

Thus, the present invention provides a front panel for a plasma display comprising a transparent substrate and two or more electroconductive films placed on the transparent substrate, the films being obtained by placing a transparent electroconductive layer on at least one side of surface of a polymer film.

DETAILED DESCRIPTION OF THE PREFERRED EMBODIMENTS

Figure 1:
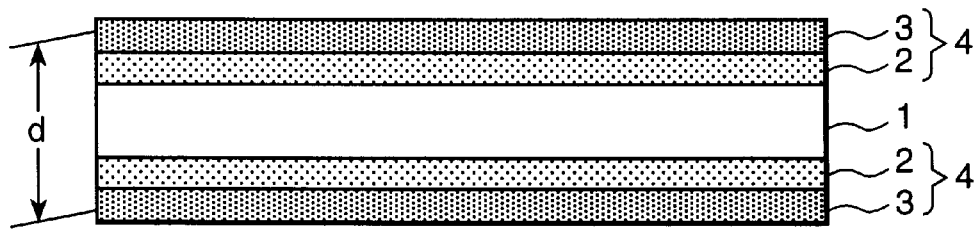
FIGS. 1 to 7 are schematic cross-sectional views of examples of the front panel for a plasma display of the present invention.

The present invention provides a front panel for a plasma display comprising a transparent substrate and two or more electroconductive films.

The transparent substrate in the front panel of the present invention preferably comprises a synthetic resin such as an acrylic resin, polycarbonate, polystyrene or methyl methacrylate-styrene copolymer, and the acrylic resin is especially preferred since it can be easily processed into the intended size and has excellent transparency. The transparent substrate used has a thickness of usually from about 0.01 mm to about 10 mm, preferably from about 0.5 mm to about 10 mm. Size of the transparent substrate is appropriately determined depending on screen size of the display.

The transparent substrate may be substantially transparent, and further, may be colored by a dye, pigment and the like. Light transmittance at a wavelength in the range of from about 400 nm to about 600 nm is usually about 50% or more, preferably about 60% or more.

Further, it may be a transparent substrate having an ability to shield a near-infrared ray generated from a plasma display. In this case, the average light transmittance at a wavelength in the range of from about 850 nm to about 1000 nm is preferably about 10% or less.

The transparent substrate having the ability to shield a near-infrared ray can be produced, for example, by molding a resin composition comprising a compound containing elemental copper, and a copolymer obtained by copolymerizing a monomer having an unsaturated double bond and an elemental phosphorus-containing monomer (, which is described in detail, for example, in Japanese Patent Application Laid-Open (JP-A) No. Hei 6-118228), a resin composition comprising a copper compound and a phosphorus compound (, which is described in detail, for example, in Japanese Patent Application Publication (JP-B) No. 62-5190; corresponding to U.S. Pat. No. 4,296,214), a resin composition comprising a copper compound and a thiourea derivative (, which is described in detail, for example, in Japanese Patent Application Laid-Open (JP-A) No. Hei 6-73197; corresponding to U.S. Pat. No. 5,514,740), a resin composition comprising a tungsten-based compound (, which is described, for example, in U.S. Pat. No. 3,647,729), or the like.

On the transparent substrate of the present invention, it is preferable that the substrate surface of at least one side on which the electroconductive film is laminated has been subjected to a hard coat treatment, so that when exposed to high temperature generated from the plasma display for long period of time, the electroconductive film is not easily released from the transparent substrate, and in the case in which the transparent substrate comprises an acrylic resin, the effect is remarkable.

The hard coat layer used in the present invention could be a commonly used one. Examples thereof include layers prepared by polymerization and curing of polyfunctional monomers or oligomers thereof. Examples of the polyfunctional monomer include acryl-based monomers, silicon-based monomers, epoxy-based monomers, melamine-based monomers and the like. A hard coat agent such as an acryl-based hard coat agent, silicon-based hard coat agent, epoxy-based hard coat agent or melamine-based hard coat agent, which contains one or more of the above polyfunctional monomers or oligomers thereof as a main component, is applied and then, is polymerized and cured to form a hard coat layer.

As the acryl-based monomer, for example, a polymerizable compound containing at least two (meth)acryloyloxy groups in the molecule, and the like may be listed.

Here, the term "(meth)acryloyloxy" represents both acryloyloxy and methacryloyloxy, and hereinafter, the term "(meth)" has an analogous meaning indicating the optional presence of a methyl substituent.

Specific examples of the polymerizable compound include an ester compound of a polyhydric alcohol with (meth)acrylic acid, a urethane-modified (meth)acrylic oligomer obtained from a compound having an isocyanate group at the end and a (meth)acrylic acid derivative having a hydroxyl group, and the like.

Examples of the polyhydric alcohol include dihydric alcohol such as ethylene glycol, diethylene glycol, polyethylene glycol, propylene glycol, polypropylene glycol, propane diol, butane diol, pentane diol, hexane diol, neopentyl glycol, 2-ethyl-1,3-hexanediol, 2,2'-thiodiethanol and 1,4- cyclohexane dimethanol, and tri- or more hydric alcohol such as trimethylol propane, pentaglycerol, glycerol, pentaerythritol, diglycerol, dipentaglycerol and dipentaerythritol.

To such an ester compound of a polyhydric alcohol with (meth)acrylic acid, a polyvalent unsaturated carboxylic acid may be further added in small amount to prepare a mixed ester for imparting flexibility to the resulting cured film to prevent cracking.

Examples of the polyvalent unsaturated carboxylic acid include succinic acid, tetrahydro phthalic acid, phthalic acid, maleic acid, fumaric acid, itaconic acid, and the like.

A urethane-modified (meth)acrylic oligomer can be obtained, for example, by reacting a (meth)acrylic acid derivative with an end isocyanate polyurethane obtained by reacting a polyisocyanate with an oligomer having a plurality of hydroxyl groups. As the polyisocyanate, hexamethylene diisocyanate, isophorone isocyanate and the like may be exemplified; as the oligomer having a plurality of hydroxyl groups, polycaprolactone diol, polytetramethylene diol and the like may be exemplified; and as the (meth)acrylic acid derivative, (meth)acrylic acid hydroxyalkylated compounds such as (meth)acrylic acid-2-hydroxyethyl and (meth) acrylic acid-2-hydroxypropyl may be exemplified.

The polyfunctional monomer or oligomer thereof is usually, for example, mixed with an initiator and then, is applied on a transparent substrate by a common method such as a spin coating method, immersion coating method, roll-coat coating method, gravure-coat coating method and curtain flow coating method and then, it is polymerized and cured. Further, it may be diluted with various kinds of solvents before being applied, and in this case, the solvent is usually evaporated by the curing after the applying.

For polymerization and curing, a method such as an ultraviolet ray curing method, heat curing method, electron beam curing method or the like is appropriately conducted depending on the kind of the polyfunctional monomer or oligomer thereof to be used.

The thickness of the hard coat layer thus formed on the surface of the transparent substrate is not particularly restricted, and preferably from about 1 μm to about 20 μm. When the thickness is less than about 1 μm interference stripes derived from the hard coat layer tend to easily occur, and when over about 20 μm, cracking tends to easily occur on the hard coat layer. For improving fitting property between the transparent substrate and the hard coat layer, an adhesive layer may be provided between the transparent substrate and the hard coat layer.

On the transparent substrate, two or more electroconductive films are placed. The electroconductive film is obtained by placing a transparent electroconductive layer on at least one surface of a polymer film.

As the transparent electroconductive layer, for example, a layer made of metal and a layer made of one or more metal oxides may be listed. Metals such as gold, silver, platinum, palladium, copper, titanium, chromium, molybdenum, nickel and zirconium, and metal oxides such as silicon oxide, titanium oxide, tantalum oxide, tin oxide, indium oxide, zirconium oxide and zinc oxide may be exemplified respectively, and these may be used alone or in combination of two or more. Among them, silver is preferred since an electroconductive film having excellent electroconductivity is easily obtained with silver.

When the transparent electroconductive layer is a layer made of metal (, which is called "a metal layer" hereinafter,) it is preferred that dielectric layers are placed on the both sides of surface of the transparent electroconductive layer since reflection of visible light by the metal layer can be lowered by the dielectric layers. Examples of the transparent electroconductive layer in view of structure include the following: (, in the following, "A/B" represents A is followed by B in a layer,)

a dielectric layer/a metal layer/a dielectric layer (, that is a three layer structure), a dielectric layer/a metal layer/a dielectric layer/a metal layer/a dielectric layer (, that is a five layer structure), a dielectric layer/a metal layer/a dielectric layer/a metal layer/a dielectric layer/a metal layer/a dielectric layer (, that is a seven layer structure), a dielectric layer/a metal layer/a dielectric layer/a metal layer/a dielectric layer/a metal layer/a dielectric layer/a metal layer/a dielectric layer (, that is a nine layer structure), a dielectric layer/a metal layer/a dielectric layer/a metal layer/a dielectric layer/a metal layer/a dielectric layer/a metal layer/a dielectric layer/a metal layer/a dielectric layer (, that is an eleven layer structure)

The surface resistance of the transparent electroconductive layer is usually 50 Ω/□ or less, preferably 10 Ω/□ or less, more preferably 6 Ω/□ or less for obtaining sufficient electromagnetic wave shielding function.

The transparent electroconductive layer can be placed on the surface of a polymer film, for example, by a method such as vacuum deposition, sputtering, ion-plating or the like. The thickness of the transparent electroconductive layer is usually from about 30 nm to about 1000 nm, preferably from about 50 nm to about 500 nm. When the thickness is less than 30 nm, electroconductivity tends to be insufficient, though it depends on the kind of metal and metal oxide constituting the transparent electroconductive layer. On the other hand, when the thickness is more than 1000 nm, the transparency tends to be deficient, and for example, the tendency is remarkable when silver or the like is used.

The polymer film, on which the transparent electroconductive layer is formed, is not particularly restricted, providing it has transparency, and in view of easy handling, processability and economy, there are usually used an ester-based resin film mainly containing an ester-based resin such as polyethylene terephthalate an acryl-based resin film mainly containing an acryl-based resin such as polymethyl methacrylate, a cellulose-based resin film mainly containing a cellulose-based resin such as triacetylcellulose, a film mainly containing an olefin-based resin such as polypropylene or polymethylpentene, a polycarbonate-based resin film mainly containing a polycarbonate resin, a polyvinyl chloride-based resin film mainly containing a polyvinyl chloride resin, or the like. The thickness of the film is usually from about 20 μm to about 500 μm.

The electroconductive film can be obtained by cutting out of a film which is produced by using a roll film as a raw polymer film and a transparent electroconductive layer having been continuously placed on the polymer film.

In the front panel for a plasma display of the present invention, it is necessary that the two or more electroconductive films are placed on the transparent substrate. Three or more electroconductive films may be placed, however, two electroconductive films are usually placed in view of cost and procedure of the production process thereof since a desired electromagnetic-wave-shielding property is able to be obtained when two electroconductive films are placed.

As shown in FIGS. 2 to 5, two or more electroconductive films 4 may be placed on at least one side of surface of the transparent substrate 1, or as shown in FIG. 1, the films 4 may be placed on both sides of surface of the transparent substrate 1.

For placing the electroconductive film on the transparent substrate, for example, an adhesive may be used effectively. As the adhesive, for example, an acryl-based adhesive, rubber-based adhesive and the like may be listed. For the placement, for example, the adhesive is applied on one side of surface of an electroconductive film, then, the electroconductive film is placed on a transparent substrate, then, they are press-bonded by using a roll press-bonding pasting machine, batch-wise pasting machine or the like. When the electroconductive film is placed on a transparent substrate so that the transparent electroconductive layer of the film faces outward, the adhesive may advantageously be applied on the surface of the electroconductive film on the side opposite to the side on which the transparent electroconductive layer is placed.

In this specification, the terms "outward" and "inward" mean "outward relative to the transparent substrate" and "inward relative to the transparent substrate" respectively.

Figure 2:
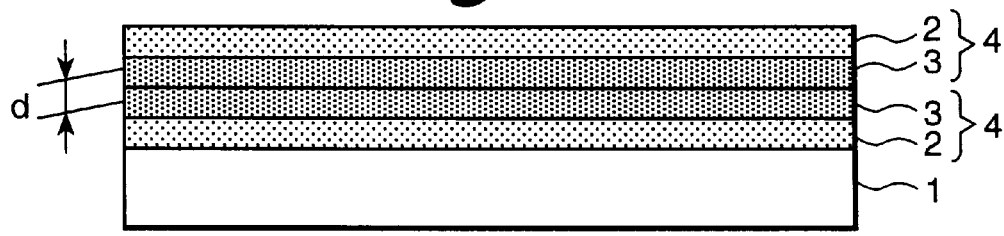
Figure 3:
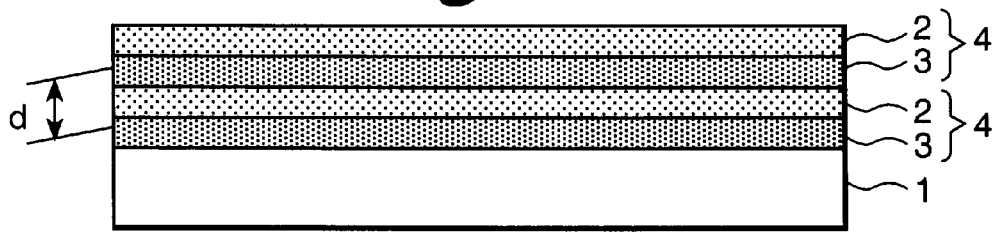

When two electroconductive films 4 are placed on one side of surface of the transparent substrate 1, as shown in FIG. 2, an electroconductive film 4 may be placed on a transparent substrate 1 so that the transparent electroconductive layer 3 faces outward, and onto this may be placed another electroconductive film 4 so that the transparent electroconductive layer 3 faces inward, or as shown in FIG. 3, an electroconductive film 4 may be placed on a transparent substrate 1 so that the transparent electroconductive layer 3 faces inward, and onto this may be placed another electroconductive film 4 so that the transparent electroconductive layer 3 also faces inward. Or as shown in FIG. 4, the electroconductive film 4 may by placed on a transparent substrate 1 so that the transparent electroconductive layer 3 faces inward, and onto this may be placed another electroconductive film 4 so that the transparent electroconductive layer 3 faces outward.

Figure 5:
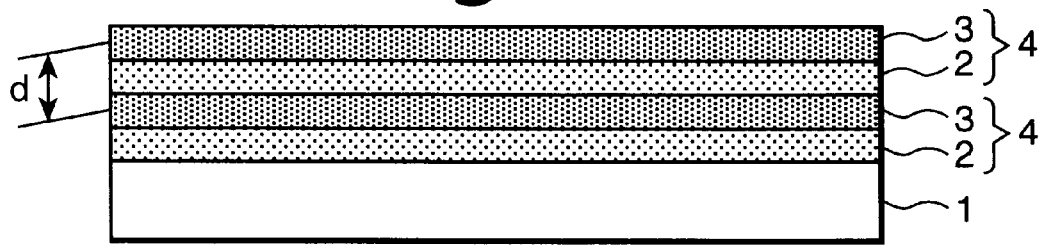

Further, as shown in FIG. 5, the electroconductive film 4 may be placed on a transparent substrate 1 so that the transparent electroconductive layer 3 faces outward, and onto this may be placed another electroconductive film 4 so that the transparent electroconductive layer 3 also faces outward.

Figure 4:
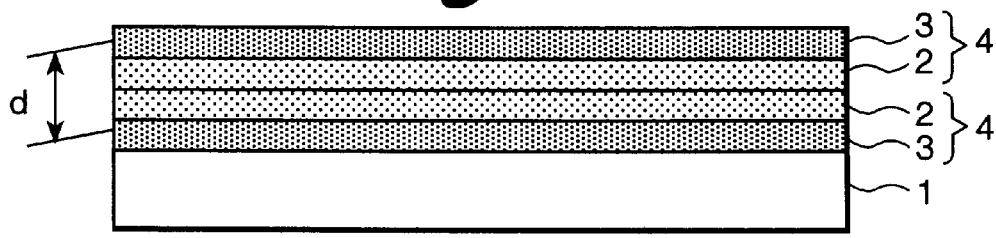

In the front panel shown in FIG. 2 or in FIG. 3, both two transparent electroconductive layers 3 are placed internally in the structure of the front panel using an adhesive and, therefore, the front panel can not be earthed from the electroconductive layers so easily, but in the front panel shown in FIG. 4 or in FIG. 5, at least one transparent electroconductive layer is placed externally and onto that is there no adhesive, so the front panel can be easily earthed via the electroconductive layer compared with the panel shown in FIG. 2 or in FIG. 3 and, therefore, is preferred.

When one or more electroconductive films are placed on one side of surface of the transparent substrate, one or more electroconductive films may further be placed on the other side of surface thereof.

Figure 6:
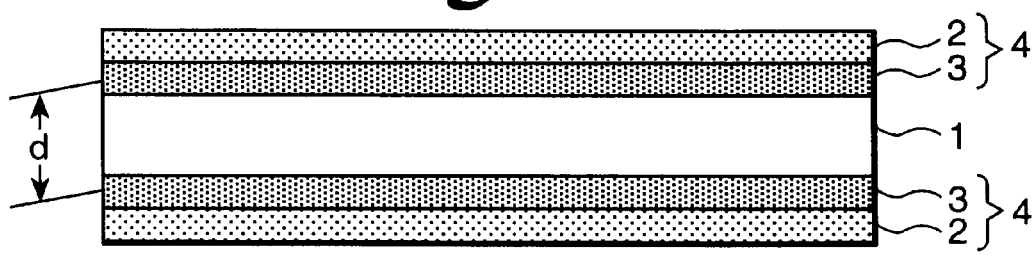
Figure 7:
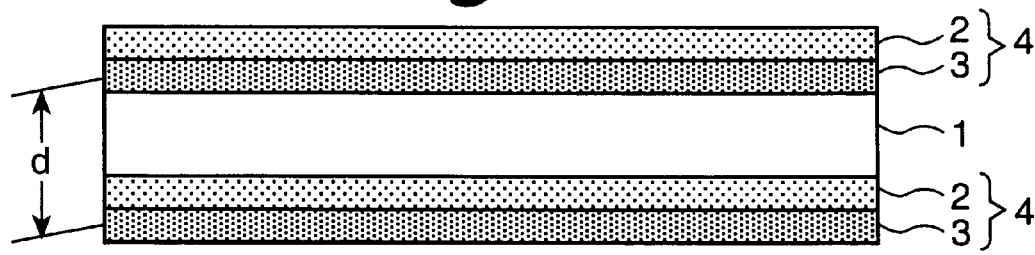

When one electroconductive film 4 is placed on each side of surface of the transparent substrate 1, the electroconductive films 4 may be placed so that both two transparent electroconductive layer 3 of the electroconductive films 4 face inward as shown in FIG. 6, however, it is preferable that at least one electroconductive film 4 is placed so that the transparent electroconductive layer 3 of the electroconductive film 4 faces inward and one electroconductive film 4 is placed so that the transparent electroconductive layer 3 of the electroconductive film 4 faces outward as shown in FIG. 7, and it is more preferable that one electroconductive film 4 is placed on each side of the transparent substrate 1 so that each transparent electroconductive layer 3 of the electroconductive films 4 faces outward as shown in FIG. 1, since the front panel shown in FIG. 7 or in FIG. 1 can be easily earthed compared with the panel shown in FIG. 6.

In the front panel of the present invention, the distance "d" of the transparent electroconductive layers placed on each electroconductive film is preferably 0.5 mm or more, more preferably 2 mm or more, and furthermore preferably in the range of from 2.5 mm to 10 mm in view of ability for shielding an electromagnetic wave generated from a plasma display.

When the electroconductive films are placed on both sides of surface of the transparent substrate, as shown in FIGS. 1, 6 and 7, the distance "d" is essentially equal to at least the thickness of the transparent substrate, plus the thickness of the electroconductive layer, and is usually from about 0.01 mm to about 10 mm, preferably from about 0.5 mm to about 10 mm. When the electroconductive films are placed on one side of surface of the transparent substrate, as shown in FIGS. 2 to 5, especially when an electroconductive film is placed on one side of surface of the transparent substrate so that the transparent electroconductive layer faces outward, and onto this, another transparent electroconductive film is further placed on the former electroconductive film so that the transparent electroconductive layer of the latter film faces outward as shown in FIG. 5, the distance "d" is essentially equal to the thickness of the polymer film consisting of the electroconductive film to be placed and is usually from about 20 $\mu$m to about 500 $\mu$m. Therefore, in view of electromagnetic wave shielding ability, the electroconductive films are preferably placed on both sides of surface of a transparent substrate having a thickness of about 2 mm or more.

Thus, the front panel of the present invention is obtained, and in this front panel, other films such as an anti-reflection film, near-infrared shielding film and surface protection film may be further applied on the electroconductive film.

The anti-reflection film is a film which is obtained by placing an anti-reflection layer on a transparent film. The anti-reflection film is a film having poor electroconductivity and the surface resistance thereof is usually over 50 $\Omega/\square$. Examples of this anti-reflection layer include a layer comprising a substance having a low refractive index, such as magnesium fluoride or silicon oxide, and a multilayer comprising a combination of a layer comprising a substance having a high refractive index such as titanium oxide, tantalum oxide, tin oxide, indium oxide, zirconium oxide or zinc oxide with a layer comprising a substance having a low refractive index. Aluminum oxide may be placed between the anti-reflection layer and the transparent film in the anti-reflection film. In the case of using the aluminum oxide, the anti-reflection film may have the following conformation of:

a silicon oxide layer/a magnesium fluoride layer/an aluminum oxide layer/a transparent film.

A film used as the anti-reflection film is not particularly restricted, providing it has transparency, and in view of easy handling, processability and economy, there are usually used a film mainly containing an ester-based resin such as polyethylene terephthalate, a film mainly containing an acryl-based resin such as polymethyl methacrylate, a film mainly containing a cellulose-based resin such as triacetylcellulose, a film mainly containing an olefin-based resin such as polypropylene or polymethylpentene, a film mainly containing a polycarbonate resin, a film mainly containing a polyvinyl chloride resin, or the like. The thickness of the film is usually from about 20 μm to about 500 μm. It is preferable that the surface of the film has been subjected to hard coat treatment in view of hardness of the surface. The hard coat treatment is conducted in the same manner as described above.

The anti-reflection layer can be formed on the film, for example, by a vacuum deposition method, a sputtering method and an ion-plating method, and a thickness thereof is appropriately determined depending on an effect of the anti-reflection and is usually from about 100 nm to about 500 nm.

A stain-proofing layer may further be formed on the surface of the anti-reflection film. The stain-proofing layer can be easily formed, for example, by applying a solution of fluorine-based or silicon-based coupling agents on the anti-reflection film and then drying it.

The anti-reflection film may be placed on an electroconductive film using, for example, an adhesive. Examples of the adhesive include an acryl-based adhesive, a rubber-based adhesive and the like. The anti-reflection film may be placed on an electroconductive film in the same manner as in the electroconductive film being placed on the transparent substrate.

Further, for protecting the electroconductive film, a film which has been subjected to hard coat treatment, and the like may be placed on the electroconductive film as a surface protecting film.

This surface protecting film may be placed on the electroconductive film, for example, by using an adhesive. As the pressure sensitive adhesive, for example, an acryl-based pressure sensitive adhesive, rubber-based pressure sensitive adhesive and the like may be listed. The surface protecting film may be placed in the same manner as for the electroconductive film being placed on the transparent substrate.

The front panel of the present invention is excellent as a front panel for a plasma display since it can effectively shield an electromagnetic wave generated from the screen of the plasma display and can be simply produced.

The entire disclosure of Japanese Patent Application No.9-162672 filed on Jun. 19, 1997, including specification, claims, drawings and summary, are incorporated herein by reference in their entirety.

The following examples further illustrate the present invention in detail, but do not limit the scope thereof.

Evaluation methods are as follows.

(1) Light transmittance :

Light transmittance of the front panel was measured in the range of from 400 nm to 1000 nm by using an automatic-recording spectrophotometer Model 330 manufactured by Hitachi, Ltd.

(2) Surface reflectance :

Sarface reflectance of the front panel was measured at an incident angle of 15 degrees in the range of from 300 nm to 800 nm by using an automatic-recording spectrophotometer Model MPS-2000 manufactured by Shimadzu Corporation.

(3) Visibility:

The front panel was installed to the front face of a 20-inch plasma display and the screen was observed through the panel and then, differences in color and border of the image between before and after installing the front panel were confirmed.

(4) Electromagnetic wave shielding performance:

Electromagnetic wave strength was measured by a shield material evaluation system Model R 2547 (manufactured by Advantest Corporation), and the electromagnetic wave shielding performance of the front panel was calculated according to the following evaluation. When this value is higher, the electromagnetic wave shielding ability of the front panel is higher.

Electromagnetic wave shielding performance(dB)=20$Log_{10}$ ($X_0/X$)

($X_0$: electromagnetic wave strength when the front panel is not installed, X: electromagnetic wave strength when the front panel is installed)

(5) Near-infrared ray shielding performance (Remote control test):

A plasma display apparatus (Model PDS 1000, manufactured by Fujitsu General Co., Ltd.) to which the front panel has been installed was placed at a tilted angle of 15 degrees to the panel perpendicular to a domestic television, ahead of, and at a distant of 10 m from the television, and the image was exhibited. A remote-control signal (signal wavelength: 950 nm) was transmitted to the television from a position at an angle of 15 degrees titled in the direction opposite to the plasma display, ahead of, and at a distance of 3 m from the television to confirm that the television responds normally. Then, the plasma display apparatus was brought close to the television to measure the distance between the plasma display apparatus and the domestic television when the television became out of normal control.

If a near-infrared ray generated from the display apparatus is not shielded, normal remote control can not be effected and the response is not recognized or mulfunction is caused. When the distance at which normal remote control is lost is shorter, the near-infrared ray shielding ability of the front panel is more excellent. (6) High temperature durable test:

The front panel was placed in an oven at 80° C., was taken out after 1000 hours lapsed, and then the change in appearance of the front panel was visually observed.

Reference Example 1 (An example of production of transparent substrate)

Into an acryl-based hard coat agent Koei M 101, manufactured by Koei Chemical Industries Ltd., diluted by a mixed solvent comprising xylene, ethyl acetate and ethylene glycol monobutyl ether (mixing ratio 3:1:1) so that solid component content was 40% was immersed a transparent substrate, which is acryl resin plate SUMIPEX E having size of 600 mm×400 mm and a thickness of 4 mm, manufactured by Sumitomo Chemical Co., Ltd., and the substrate was lifted at a rate of 30 cm/minute to apply the hard coat agent on both sides of surface of the transparent substrate. The mixed solvent was vaporized, then, a hard coat layer was formed on both sides of surface of the transparent substrate by being irradiated by a 120 W metal halide lamp UB 0451, manufactured by AI GRAPHIC from a distance of 20 cm for 10 seconds.

Reference Example 2 (Another example of production of a transparent substrate)

Into 100 parts by weight of a mixture comprising 45% by weight of methyl methacrylate, 25% by weight of isobornyl methacrylate and 30% by weight of polyethylene glycol dimethacrylate in which an average molecular weight of the polyethylene glycol is 200 were added 4 parts by weight of an elemental phosphorus-containing compound represented by the formula (1):

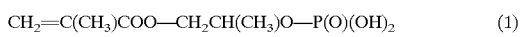  (1)

and 10 parts by weight of an elemental phosphorus-containing compound represented by the formula (2):

  (2)

and were further added and dissolved 5 parts by weight of anhydrous copper benzoate as an elemental copper-containing compound and 0.5 parts by weight of t-butylperoxy-2-ethyl hexanoate as a radical polymerization initiator.

This solution was poured into a polymerization cell composed of a gasket made of polyvinyl chloride having a thickness of 3 mm and two pieces of glass plates of 620 mm×420 mm×10 mm, and was heated for 12 hours at 50° C. and subsequently for 2 hours at 100° C. for conducting thermal polymerization, to obtain a transparent substrate, which is in the form of a plate and has a size of 600 mm×400 mm and a thickness of 3 mm, having an ability for shielding near-infrared ray.

Into a urethane acrylate-based hard coat agent Koei hard M101, manufactured by Koei Chemical Industries Ltd., diluted by a mixed solvent comprising xylene, ethyl acetate and ethylene glycol monobutyl ether (mixing ratio 3:1:1) so that solid component content was 40% was immersed the above-obtained transparent substrate, and the substrate was lifted at a rate of 30 cm/minute to apply the hard coat agent on both sides of surface of the transparent substrate, and the mixed solvent was vaporized and then, a hard coat layer was formed on both sides of surface of the transparent substrate by being irradiated by a 120 W metal halide lamp UB 0451, manufactured by AI GRAPHIC from a distance of 20 cm for 10 seconds.

Reference Example 3 (An example of production of anti-reflection film)

An indium oxide-tin oxide (ITO) layer, silicon oxide layer, ITO layer, silicon oxide layer were sequentially placed in this order for formation of anti-reflection layers by DC magnetron sputtering method on a polyethylene terephthalate (hereinafter, re erred to as PET) film having a thickness of 188 μm and being manufactured by Toyobo Co., Ltd., (trade name: ESTER FILM), to obtain an anti-reflection film.

A fluorine-containing compound having a number-average molecular weight of about 5000 represented by the formula (3)

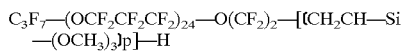

$$C_3F_7-(OCF_2CF_2CF_2)_{24}-O(CF_2)_2-[(CH_2CH-Si-(OCH_3)_3)p]-H \quad (3),$$

wherein "p" represents an integral number and the average value of p is 2.0, was diluted by tetradecafluorohexane to obtain a solution in which the concentration of the above-described fluorine-containing compound is 0.1% by weight.

A mask film was placed on the side of surface opposite to the side of surface of the anti-reflection layer of the anti-reflection film obtained above and then, the anti-reflection film was immersed into a solution obtained above, was lifted at a rate of 15 cm/minute, to coat the both sides of surface of the film. After that, the film was left for a day at room temperature for evaporation of the mixed solvent, to form a stain-proofing layer on the anti-reflection layer.

EXAMPLE 1

Onto each side of surface of the transparent substrate obtained in Reference Example 1 was placed an electroconductive film ALTAIR XIR manufactured by US Southwall Technologies Corp. having a size of 600 mm×400 mm and consisting of a plurality of transparent electroconductive layers such as a silver layer, having surface resistance of 3.2 Ω/□ as shown in FIG. 1, further onto each side of surface thereof was placed an anti-reflection film obtained in Reference Example 3, to obtain a front panel. The placement of the electroconductive films and the anti-reflection films, was conducted by roll press bonding method by using an adhesive.

This front panel had a penetrating color of off-yellowish light-blue and had remarkably excellent appearance, and a reflection of a background was remarkably low. Visibility of this front panel was excellent when the front panel was installed in front of a plasma display. Further, in the remote control test, the domestic television was able to be normally controlled until the distance between the plasma display and the domestic television was shortened to 1.0 m. The evaluation results of a light transmittance, a surface reflectance, an electromagnetic wave shielding performance and a high temperature durable test are shown in Tables 1 to 4.

COMPARATIVE EXAMPLE 1

Onto one side of surface of the transparent substrate obtained in Reference Example 2 was placed an electroconductive film ALTAIR XIR manufactured by US Southwall Technologies Corp., further, an anti-reflection film obtained in Reference Example 3 was placed on each side of surface thereof, to obtain a front panel. The placement of the electroconductive film and the anti-reflection films, was conducted by roll press bonding method by using an adhesive.

This front panel had a penetrating color of off-yellowish light-blue and had excellent appearance, and a reflection of a background was remarkably low. Visibility of this front panel was excellent when the front panel was installed in front of a plasma display. Further, in the remote control test, the domestic television was able to be normally controlled until the distance between the plasma display and the domestic television was shortened to 1.3 m. The evaluation results of a light transmittance, a surface reflectance, an electromagnetic wave shielding performance and a high temperature durable test are shown in Tables 1 to 4.

EXAMPLE 2

A front panel was obtained in the same manner as in Example 1 except that a PET film having a thickness of 50 μm manufactured by Toyobo Co., Ltd. which had been subjected to hard coat treatment was used instead of the anti-reflection film. This front panel was installed in front of a plasma display so that the side of surface having the electroconductive layer was used as an exhibiting screen. This front panel had a penetrating color of off-light-blue and had excellent appearance. Further, in the remote control test, the domestic television was able to be normally controlled until the distance between the plasma display and the domestic television was shortened to 1.0 m. The evaluation results of a light transmittance, a surface reflectance, an electromagnetic wave shielding performance and a high temperature durable test are shown in Tables 1 to 4.

EXAMPLE 3

Onto each side of surface of a transparent substrate, which was acryl resin plate SUMIPEX having size of 200 mm×200 mm and a thickness of 3 mm, manufactured by Sumitomo Chemical Co., Ltd., was placed the electroconductive film ALTAIR XIR having a size of 200 mm×200 mm so that each transparent electroconductive layer of the electroconductive films faced outward as shown in FIG. 1, to obtain a front panel. The placement of the electroconductive films was conducted by roll press bonding method by using an adhesive. The evaluation results of an electromagnetic wave shielding performance and a high temperature durable test are shown in Tables 3 to 4.

EXAMPLE 4

Onto one side of surface of the same transparent substrate as used in Example 3, were placed the two electroconductive films ALTAIR XIR so that both transparent electroconductive layers of the electroconductive films faced outward as shown in FIG. 5, provided that the nearer transparent electroconductive layer to the substrate had a size of 200 mm×200 mm and the upper transparent electroconductive layer had a size of 190 mm×190 mm, to obtain a front panel. The exposed surface of the nearer transparent electroconductive layer to the substrate was seen 5 mm in each width at the periphery on the front panel, since the size of the nearer transparent electroconductive layer is larger than the other upper one. The placement of the electroconductive films was conducted by roll press bonding method by using an adhesive. The evaluation results of an electromagnetic wave shielding performance and a high temperature durable test are shown in Tables 3 to 4.

TABLE 1

| | Light transmittance (%) | | |
| --- | --- | --- | --- |
| Wavelength | Example 1 | Comparative example 1 | Example 2 |
| 300 nm | 0.4 | 0.2 | 0.4 |
| 400 nm | 39.7 | 44.0 | 39.6 |
| 500 nm | 67.6 | 67.8 | 67.1 |
| 600 nm | 63.2 | 65.8 | 62.9 |
| 700 nm | 37.7 | 16.9 | 37.4 |
| 800 nm | 10.1 | 2.0 | 9.9 |
| 900 nm | 2.7 | 1.0 | 2.5 |
| 1000 nm | 1.4 | 0.8 | 1.4 |

TABLE 2

| | Surface reflectance (%) | | |
| --- | --- | --- | --- |
| Wavelength | Example 1 | Comparative example 1 | Example 2 |
| 300 nm | 12.8 | 12.3 | 12.9 |
| 400 nm | 4.0 | 6.9 | 10.0 |
| 500 nm | 2.5 | 1.5 | 8.5 |
| 600 nm | 0.8 | 0.5 | 7.7 |
| 700 nm | 13.8 | 11.2 | 18.0 |
| 800 nm | 44.1 | 43.0 | 50.5 |

TABLE 3

| | Electromagnetic wave shielding performance | | | | |
| --- | --- | --- | --- | --- | --- |
| Frequency | Example 1 | Comparative example 1 | Example 2 | Example 3 | Example 4 |
| 30 MHz | 63 dB | 55 dB | 62 dB | 61 dB | 57 dB |
| 50 MHz | 57 dB | 49 dB | 55 dB | 56 dB | 53 dB |
| 70 MHz | 53 dB | 45 dB | 52 dB | 52 dB | 50 dB |
| 90 MHz | 51 dB | 42 dB | 51 dB | 50 dB | 48 dB |

TABLE 4

| Example | Change in appearance in a high temperature durable test |
| --- | --- |
| Example 1 | No change |
| Comparative example 1 | No change |
| Example 2 | No change |
| Example 3 | No change |
| Example 4 | No change |

What is claimed is:

1. A front panel for a plasma display comprising a transparent substrate and two or more electroconductive films, each electroconductive film comprising a transparent polymer film with a transparent electroconductive layer on at least one surface thereof.

2. The front panel for a plasma display according to claim 1, wherein two or more electroconductive films are present on one side of the transparent substrate.

3. The front panel for a plasma display according to claim 2, each electroconductive film comprising a transparent polymer film with a transparent electroconductive layer on one surface thereof, wherein a first electroconductive film on one side of the transparent substrate is oriented so that its transparent electroconductive layer faces outward relative to the transparent substrate, and a second electroconductive film superimposed on the first electroconductive film is oriented so that its transparent electroconductive layer faces outward relative to the transparent substrate.

4. The front panel for a plasma display according to claim 1, wherein at least one electroconductive film is present on each side of the transparent substrate.

5. The front panel for a plasma display according to claim 4, each electroconductive film comprising a transparent polymer film with a transparent electroconductive layer on one surface thereof, wherein the electroconductive films on both sides of the transparent substrate are oriented so that their electroconductive layers face outward relative to the transparent substrate.

6. The front panel for a plasma display according to claim 5, wherein the distance between the transparent electroconductive layer of any electroconductive film on one side of the transparent substrate, and the transparent electroconductive layer of any electroconductive film on the opposite side of the transparent substrate is 0.5 mm or more.

7. The front panel for a plasma display according to claim 1, which further comprises a hard coat layer on at least one surface of the transparent substrate, on the side of the transparent substrate on which at least one electroconductive film is present.

8. A plasma display apparatus comprising the front panel for a plasma display according to claim 1.

9. A method of shielding against electromagnetic radiation generated by a plasma display, which comprises placing in front of the plasma display the front panel for a plasma display as defined in claim 1.

* * * * *